United States Patent
Hsueh et al.

(10) Patent No.: US 8,022,421 B2
(45) Date of Patent: Sep. 20, 2011

(54) LIGHT EMITTING MODULE HAVING LED PIXELS AND METHOD OF FORMING THE SAME

(75) Inventors: Han-Tsung Hsueh, Hsinchu (TW); Hsi-Hsuan Yen, Hsinchu (TW); Wen-Yung Yeh, Hsinchu (TW); Mu-Tao Chu, Hsinchu (TW)

(73) Assignee: Industrial Technology Institute, Hsinchu (TW)

( * ) Notice: Subject to any disclaimer, the term of this patent is extended or adjusted under 35 U.S.C. 154(b) by 608 days.

(21) Appl. No.: 11/979,568

(22) Filed: Nov. 6, 2007

(65) Prior Publication Data
US 2009/0114931 A1    May 7, 2009

(51) Int. Cl.
*H01L 33/00* (2010.01)

(52) U.S. Cl. ............. 257/89; 257/13; 257/79; 257/103; 257/918; 257/E51.018; 257/E51.022; 257/E33.001; 257/E33.054; 257/E25.028; 257/E25.032; 257/E33.005

(58) Field of Classification Search ............ 257/89, 257/E33.005, 13, 79, 103, 918, E51.018, 257/E51.022, E33.001, E33.077, E33.054, 257/E25.028, E25.032; 438/35
See application file for complete search history.

(56) References Cited

U.S. PATENT DOCUMENTS

| | | | | |
|---|---|---|---|---|
| 5,210,766 A * | 5/1993 | Winer et al. | ............ | 372/40 |
| 5,851,905 A * | 12/1998 | McIntosh et al. | ............ | 438/492 |
| 2003/0047742 A1 * | 3/2003 | Hen | ............ | 257/89 |
| 2006/0093001 A1 * | 5/2006 | Ryu et al. | ............ | 372/43.01 |
| 2006/0216845 A1 * | 9/2006 | Wu et al. | ............ | 438/35 |
| 2006/0285185 A1 * | 12/2006 | Choi et al. | ............ | 359/15 |
| 2007/0158659 A1 * | 7/2007 | Bensce | ............ | 257/79 |
| 2008/0180641 A1 * | 7/2008 | Chiang | ............ | 353/33 |
| 2008/0211400 A1 | 9/2008 | Kim et al. | | |

* cited by examiner

*Primary Examiner* — Wael M Fahmy
*Assistant Examiner* — Marc Armand
(74) *Attorney, Agent, or Firm* — Jianq Chyun IP Office

(57) ABSTRACT

A method for forming a pixel of an LED light source is provided. The method includes following steps: forming a first layer on a substrate; forming a second layer and a first light-emitting active layer on the first layer; exposing a portion of an upper surface of the first layer; forming a third layer on the substrate; forming a fourth layer and a second light-emitting active layer on the third layer; exposing a portion of an upper surface of the third layer; and forming a first electrode on the exposed upper surface of the first layer, a second electrode on a portion of an upper surface of the second layer, a third electrode on the exposed upper surface of the third layer, and a fourth electrode a portion of an upper surface of the fourth layer. The first light-emitting active layer and the second light-emitting active layer emit different colors of light.

22 Claims, 4 Drawing Sheets

LIGHT EMITTING MODULE HAVING LED PIXELS AND METHOD OF FORMING THE SAME

FIELD OF THE INVENTION

This invention relates in general to light emitting modules. More specifically, this invention relates to light emitting modules including a substrate including multi-colored light emitting diodes.

BACKGROUND

Liquid crystal displays have been recently replacing traditional CRTs in applications like computer monitors and TVs. A liquid crystal display includes a glass cell as a light valve and a back light module as a light source. Back light modules usually comprise cold cathode fluorescent lamps and light directors. After light is emitted from the back light modules, it may be polarized first in order to be controlled by the aligned liquid crystals in the liquid crystal cell. Therefore, a first polarizer may be attached at the rear side of the glass cell and a second polarizer attached at the front side of the glass cell for controlling light emission in a transmission type liquid crystal display. After light goes through the first polarizer, at least half of the light energy would be blocked and can not contribute to the display. Therefore, several other display technologies have been developed to eliminate the use of polarizers.

Recently, light emitting diode-based displays have become a promising light source for displays. For example, light emitting diodes (LED) can be the light source of a projective type display. FIG. 7 shows a projective type display having LED array chips as its light source. The projective type display includes three single-colored LED array substrates 1R, 1G, and 1B, a dichroic lens 2, a projection lens 3, and a screen 4. Red light from red-colored LED substrate 1R, green light from green-colored LED substrate 1G, and blue light from blue-colored LED substrate 1B are mixed at dichroic lens 2 and are projected to the screen 2 via projection lens 3. Each substrate comprises only single-colored LED chips. An instance of such a substrate 1 is shown in FIG. 8. In this display, no liquid crystal panels or polarizers are needed, so light energy efficiency is improved as compared to the traditional liquid crystal display. But there is a need to integrate three-colored LED chips into one substrate to reduce the cost of light sources.

The present invention provides a light emitting module which integrates multi-colored LED structures on one substrate and the method for making the same.

SUMMARY

Consistent with embodiments of the present invention, there is provided a method for forming a pixel of an LED light source. The method includes: forming a first layer on a substrate; forming a second layer and a first light-emitting active layer on the first layer; exposing a portion of an upper surface of the first layer; forming a third layer on the substrate; forming a fourth layer and a second light-emitting active layer on the third layer; exposing a portion of an upper surface of the third layer; and forming a first electrode on the exposed upper surface of the first layer, a second electrode on a portion of an upper surface of the second layer, a third electrode on the exposed upper surface of the third layer, and a fourth electrode a portion of an upper surface of the fourth layer. The first light-emitting active layer and the second light-emitting active layer emit different colors of light.

Consistent with embodiments of the present invention, there is provided a method for forming a pixel of an LED light source. The method includes: forming a first layer on a first substrate; forming a second layer and a first light-emitting active layer on the first layer; forming a first intermediate layer on the second layer; forming a third layer on a second substrate; forming a fourth layer and a second light-emitting active layer on the third layer; cutting a portion of the second substrate including at least the third layer, the fourth layer, and the second light-emitting active layer; and placing the third layer, the fourth layer, and the second light-emitting active layer on the first intermediate layer. The first light-emitting active layer and the second light-emitting active layer emit different colors of light.

Consistent with embodiments of the present invention, there is provided a light emitting module. The light emitting module includes: a substrate; and a plurality of LED pixels. One of the LED pixels includes: a first layer on the substrate; a second layer and a first light-emitting active layer on the first layer; a first intermediate layer on the second layer; a third layer on the first intermediate layer; a fourth layer and a second light-emitting active layer on the third layer. An electrode pad is formed on each of the first layer, the second layer, the third layer, and the fourth layer, respectively.

BRIEF DESCRIPTION OF THE DRAWINGS

The accompanying drawings, which are incorporated in and constitute a part of this specification, illustrate embodiments of the invention and, together with the description, serve to explain features, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts. Consistent with embodiments of the present invention, there are provided methods for forming a micro-chip LED light source. A plurality of the micro-chip LED structures may be integrated on a single substrate and serves as a light source, for example, a light source for a projection display or a liquid crystal display.

Figure 1:
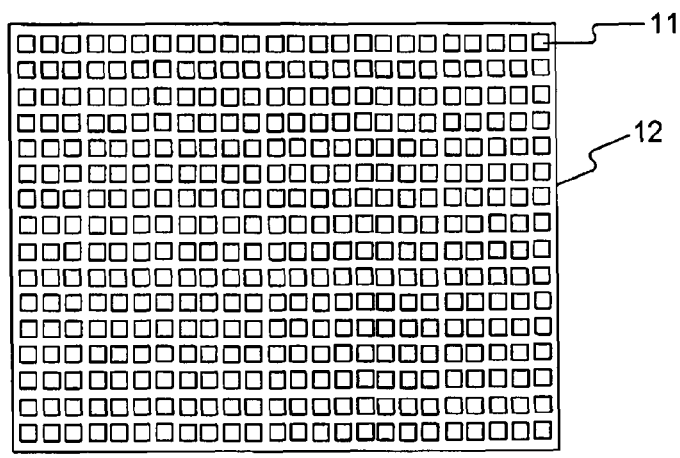
FIG. 1 shows a light emitting module including LED devices consistent with principles of the present invention.

FIG. 1 shows an embodiment consistent with the principles of the present invention. A light source 10 includes a plurality of pixels 11 arranged on a substrate 12 to form an array. The substrate may include, for example, $Al_2O_3$, GaAs, GaP, and SiC, or any combination of these materials. Each pixel 11 may at least comprise two micro-chip LED structures and each micro-chip LED structure may emit a different color of light. In accordance with an embodiment of the present invention, each pixel may include a red-colored LED, a green-colored LED, and a blue-colored LED, for example, so that a user of such light source can obtain a preferred color and intensity of light.

Figure 2:
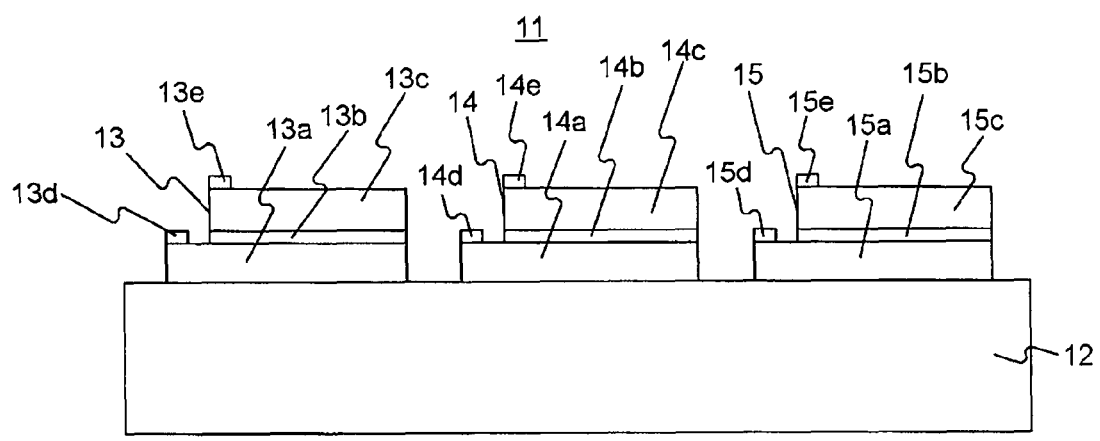
FIG. 2 shows a pixel of a light emitting module consistent with principles of the present invention.

FIG. 1 shows a light emitting module including LED devices consistent with principles of the present invention. As illustrated in FIG. 2, a pixel 11 of the light emitting module 10 may include three micro-chip LED structures 13, 14, and 15 formed on a substrate 12. At least one of the three micro-chip LED structures 13, 14, and 15 emits a color of light different from the others. In one aspect, the three micro-chip LED structures all emit different colors of light. For example, micro-chip LED structure 13 emits red light; micro-chip LED structure 14 emits green light; and micro-chip LED structure 15 emits blue light. By this arrangement, each pixel can produce a wide range of color. A process of forming pixel 11 will be explained as follows. A lower layer 13a of micro-chip LED structure 13 is formed on substrate 12. An upper layer 13c and a light-emitting active layer 13b are formed on the lower layer 13a. Layers 13a, 13b, and 13c may be deposited, for example, by conventional deposition techniques such as physical vapor deposition or chemical vapor deposition. In a process of forming upper layer 13c and light-emitting active layer 13b, at least a portion of an upper surface of lower layer 13a may be left uncovered by upper layer 13c and light-emitting active layer 13b. An electrode pad 13d is formed on the exposed upper surface of lower layer 13a, and a lead line (not shown) may be coupled to electrode pad 13d for inputting an electric current into the light-emitting active layer 13b. Similarly, an electrode pad 13e may be formed on a portion of an upper surface of upper layer 13c, and a lead line (not shown) may be coupled to electrode pad 13e.

Micro-chip LED structures 14 and 15 each may be formed using the same method as described above for forming micro-chip LED structure 13 on substrate 12. Electrode pads on each micro-chip LED structure 13, 14, and 15 may be formed, for example, simultaneously. For example, layers 13a, 13b, and 13c of micro-chip LED structure 13; layers 14a, 14b, and 14c of micro-chip LED structure 14; layers 15a, 15b, and 15c of micro-chip LED structure 15 may first be formed on substrate 12, and electrode pads 13d, 13e, 14d, 14e, 15d, and 15e may be formed simultaneously on a portion of the upper surfaces of layers 13a, 13c, 14a, 14c, 15a, and 15c, respectively. By independently inputting different electric currents to each micro-chip LED structures 13, 14, and 15 through the electrode pads, the color and the light intensity of pixel 11 can be controlled. Therefore, a light emitting module 10 shown in FIG. 1 including a pixel 11 can have improved light efficiency and color reproduction.

Figure 3:
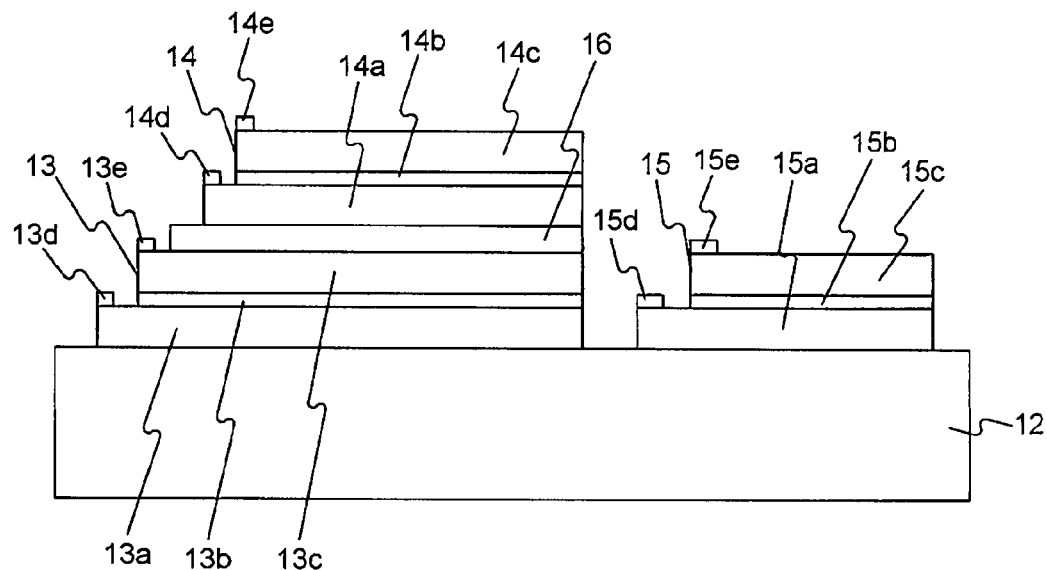
FIG. 3 shows a second pixel of a light emitting module consistent with principles of the present invention.

FIG. 3 shows a second pixel of a light emitting module consistent with principles of the present invention. In this embodiment, a pixel 11 in a light emitting module 10 as shown in FIG. 1 includes three micro-chip LED structures 13, 14, and 15 formed on a substrate 12. Micro-chip LED structures 13 and 14 are stacked on substrate 12 with an intermediate layer 16 interposed between for substantially separating micro-chip LED structures 13 and 14. Micro-chip LED structures 13 and 14 may emit a different color of light. Micro-chip LED structure 15 is also formed on substrate 12 and may be separate from micro-chip LED structures 13 and 14.

A process of forming pixel 11 is explained as follows. A lower layer 13a of micro-chip LED structure 13 is formed on substrate 12. An upper layer 13c and a light-emitting active layer 13b are formed on the lower layer 13a. In a process of forming upper layer 13c and light-emitting active layer 13b, at least a portion of an upper surface of lower layer 13a is left uncovered by upper layer 13c and light-emitting active layer 13b. A light transparent intermediate layer 16 is formed on a portion of the upper surface of layer 13c. In order to form an electrode pad coupled with layer 13c, at least a portion of the upper surface of layer 13c is left uncovered by intermediate layer 16. A lower layer 14a of micro-chip LED structure 14 is formed on intermediate layer 16. An upper layer 14c and a second light-emitting active layer 14b are formed on lower layer 14a. The formation process of one of layer 15c or layer 15a of micro-chip LED structure 15 may be in the same formation process in forming layers 13a, 13c, 14a, or 14c, for reducing the manufacturing process. For example, layer 15a may be formed in a process of forming layer 13a, and layer 15c may be formed in a process of forming layer 14c. Similar to the device structure of micro-chip LED structures 13 and 14, a portion of the upper surface of a lower layer of micro-chip LED structure 15 is left uncovered by layers 15b and 15c. Layer 15b is a light-emitting active layer of micro-chip LED structure 15. Electrode pads 13d, 13e, 14d, 14e, 15d, and 15e may be arranged on a surface portion of layers 13a, 13c, 14a, 14c, 15a, and 15c, respectively. A lead line (not shown) for inputting electrical currents to each micro-chip LED structure may be coupled to each electrode pad 13d, 13e, 14d, 14e, 15d, and 15e. In a specific embodiment, electrode pads 13d, 13e, 14d, 14e, 15d, and 15e may be formed simultaneously.

According to another aspect of the present invention, electrode pad 13e in FIG. 3 may be formed to cover a portion of intermediate layer 16 and be connected to electrode pad 14d. By this arrangement, it is possible to input driving current into layers 13c and 14a with one lead line, therefore, reducing manufacturing costs.

Alternatively, if electrode pads 13e and 14d are not connected through electrode pad 13e, electrode pads 13e and 14d may each couple with a lead line which further couples with the same electrical input, therefore, reducing the number of electrical inputs.

According to another aspect of the present invention, the formation of layers 14a, 14b, and 14c may be performed on a separate substrate. It may then be cut off from the substrate, with or without the substrate, and be placed on top of layer 13c. In this embodiment, light-transparent intermediate layer 16 which is formed on layer 13c may include an adhesive material for coupling the layer structure including at least layers 14a, 14b, and 14c to a layer structure including at least layers 13a, 13b, and 13c on substrate 12.

Alternatively, an adhesive (not shown) may be interposed between a layer structure including at least layers 14a, 14b, and 14c formed on a substrate other than substrate 12 and a layer structure including at least layers 13a, 13b, and 13c formed on substrate 12. The adhesive layer may comprise conductive particles so that it provides an electrical connection between layer 13c and 14a. When the adhesive layer is made to electrically connect layers 13c and 14a, it is possible to achieve inputting driving electric current into layers 13c and 14a with one lead line.

Figure 4:
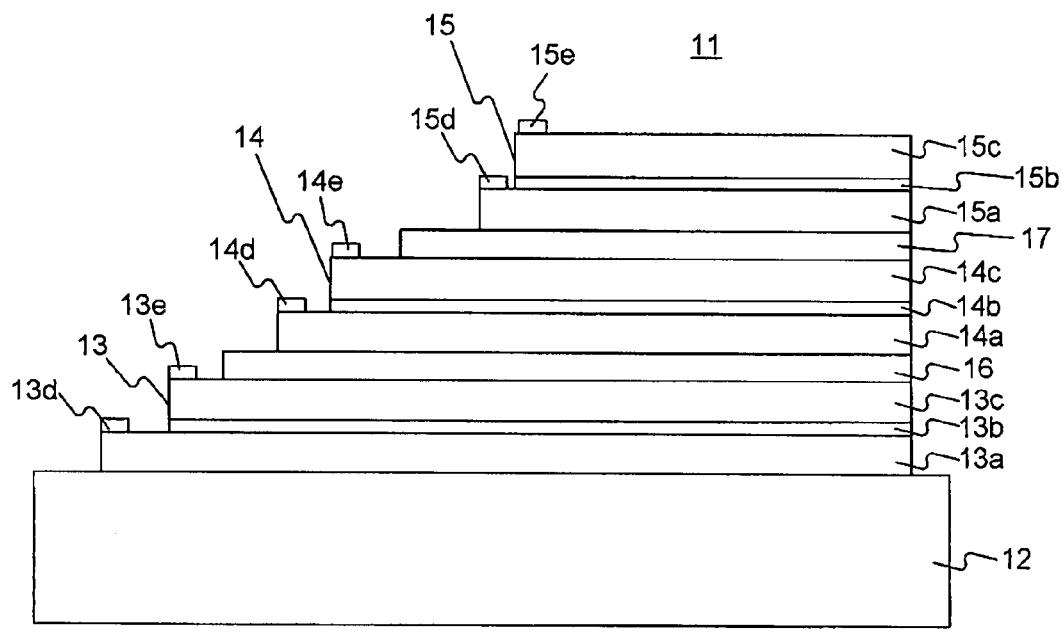
FIG. 4 shows a third pixel of a light emitting module consistent with principles of the present invention.

Referring to another embodiment consistent with the principles of the present invention, FIG. 4 shows a pixel 11 of light emitting module 10. As shown in FIG. 4, micro-chip LED structure 13 is formed on substrate 12, and micro-chip LED structure 14 is formed on micro-chip LED structure 13. A light-transparent intermediate layer 16 may be interposed between micro-chip LED structures 13 and 14. Further, a micro-chip LED structure 15 may be formed on micro-chip LED structures 14. A second light-transparent intermediate layer 17 may be interposed between micro-chip LED structures 14 and 15.

A process of forming pixel 11 is explained as follows. First, a lower layer 13a of micro-chip LED structure 13 is formed on substrate 12. An upper layer 13c and a light-emitting active layer 13b are formed on lower layer 13a. In a process of forming upper layer 13c and light-emitting active layer 13b, at least a portion of an upper surface of lower layer 13a is left uncovered by upper layer 13c and light-emitting active layer 13b. Light transparent intermediate layer 16 is formed on a portion of an upper surface of layer 13c. In order to form an electrode pad coupled with layer 13c, at least a portion of the upper surface of layer 13c is left uncovered by intermediate layer 16. A lower layer 14a of micro-chip LED structure 14 is, for example, subsequently formed on intermediate layer 16. An upper layer 14c and a second light-emitting active layer 14b are formed on lower layer 14a. Similarly, at least a portion of the upper surface of layer 14a may be left uncovered for adopting an electrode pad later.

Upon layer 14c, a second light-transparent intermediate layer 17 for providing a substantially electrical separation between micro-chip LED structures 14 and 15 is provided. A portion of an upper surface of layer 14c is left uncovered by second intermediate layer 17 for providing a connection to an electrode pad 14e. A lower layer 15a of micro-chip LED structure 15 is formed on the second intermediate layer 17. An upper layer 15c and a light-emitting active layer 15b are formed on lower layer 15a. Light-emitting active layer 15b is sandwiched between layer 15a and layer 15c. At least a portion of an upper surface of lower layer 15a is left uncovered by layers 15b and 15c for providing a connection to electrode pad 15d. Electrode pads 13d, 13e, 14d, 14e, 15d, and 15e may be arranged on a surface portion of each layer 13a, 13c, 14a, 14c, 15a, and 15c, respectively, for providing electrical driving currents to each micro-chip LED structure 13, 14, and 15. In accordance with one aspect of the present invention, electrode pads 13d, 13e, 14d, 14e, 15d, and 15e may be formed simultaneously.

According to another aspect, electrode pad 13e in FIG. 4 may be formed to cover a portion of intermediate layer 16 and be connected to electrode pad 14d. By this arrangement, only one lead line is needed to electrically coupled with both layers 13c and 14a, therefore, reducing manufacturing costs.

Alternatively, electrode pads 13e and 14d may each couple with a lead line which further couples with the same one electrical input, therefore, reducing the number of electrical inputs.

Similarly, electrode pad 14e in FIG. 4 may be formed to cover a portion of intermediate layer 17 and be connected to electrode pad 15d. By this arrangement, only one lead line is needed to electrically couple both layers 14c and 15a, thereby simplifying the manufacturing processes.

Alternatively, electrode pads 14e and 15d may be coupled with two lead lines which further couple with the same electrical input, thereby reducing the number of electrical inputs.

According to another aspect of the present invention, micro-chip LED structures 13, 14, and 15 may each be formed on different substrates and then be joined together to form a structure similar to that shown in FIG. 4. For example, micro-chip LED structure 13 is formed on substrate 12. Micro-chip LED structures 14 and 15 are each formed on a separate substrate. Micro-chip LED structures 14 and 15 are cut from their forming substrates and disposed on substrate 12. Micro-chip LED structure 14 is placed on micro-chip LED structure 13 through a light-transparent intermediate layer 16. Intermediate layer 16 may comprise an adhesive material for binding micro-chip LED structures 13 and 14. Similarly, micro-chip LED structure 15 is placed on micro-chip LED structure 14 through a second light-transparent intermediate layer 17. Intermediate layer 17 may also comprise an adhesive material for binding micro-chip LED structures 14 and 15. Further, intermediate layers 16 or 17 may include conductive particles for making an electrical connection between layers 13c and 14a, or between layers 14c and 15a. When intermediate layers 16 and 17 are made to electrically connect layers 13c and 14a, and 14c and 15a, respectively, it is possible to reduce lead lines for these layers.

Figure 5:
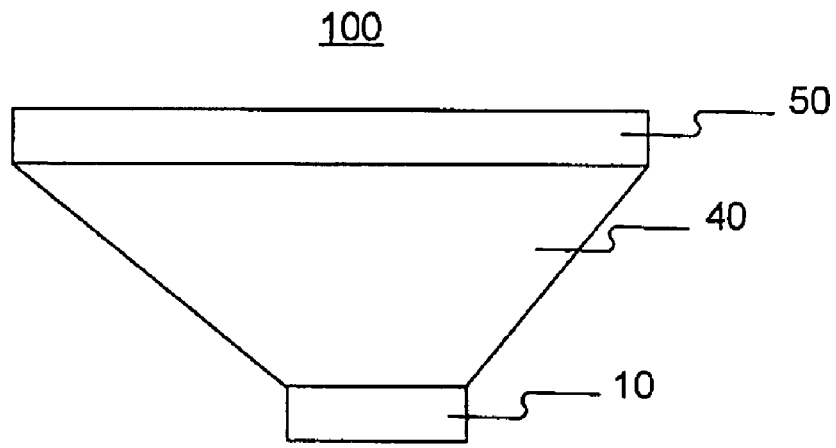
FIG. 5 shows flat panel display including a light emitting module consistent with principles of the present invention.

The light emitting module 10 including pixels of LED structures as described above can be adopted as a light source in a plurality of display devices, such as flat panel displays and projection displays. Each pixel 11 of light emitting module 10 may function as a pixel of an image on the screen of a flat panel display. A flat panel display 100 incorporating a light emitting module 10 consistent with principles of the present invention is shown in FIG. 5. In addition to light emitting module 10, flat panel display 100 may further comprise a light guide module 40 and a screen module 50. Light guide module 40 may function as an interface for transmitting light from light emitting module 10 to screen module 50. By the adoption of light emitting module 10, flat panel display 100 may have one or more of the following benefits: improved light efficiency, improved color reproduction, and user selection of preferred color and/or intensity of light.

Figure 6:
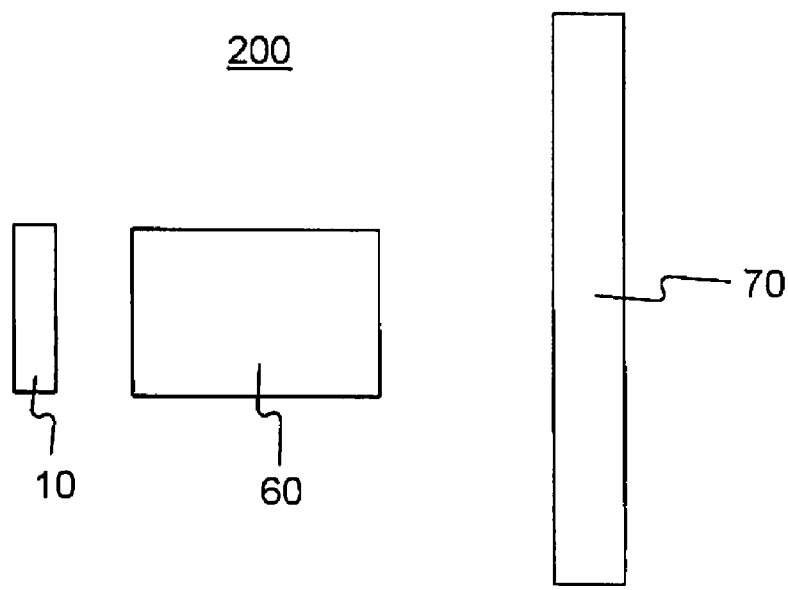
FIG. 6 shows a projection display including a light emitting module consistent with principles of the present invention.
Figure 7:
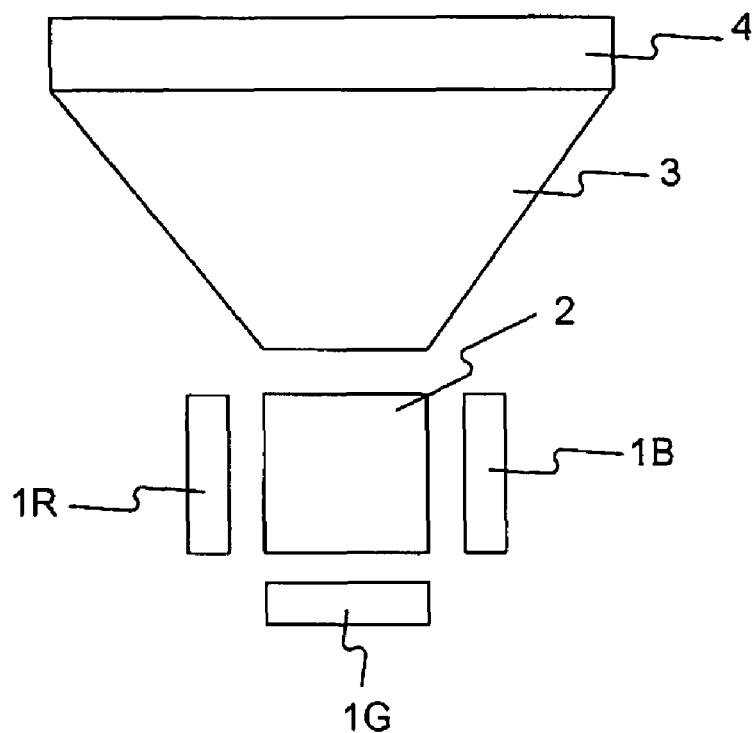
FIG. 7 shows a conventional projection display.
Figure 8:
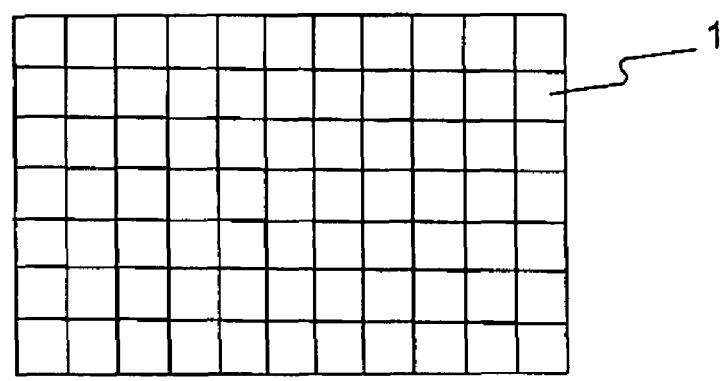
FIG. 8 shows a light emitting module in a conventional projection display.

The light emitting module 10 may also be used in a projection display as shown in FIG. 6. The projection display 200 may include a light emitting module 10, a projecting lens module 60, and a screen module 70. Light emitting module 10 may include a plurality of pixels. Each pixel may have the features illustrated in FIG. 2, 3, or 4, so that projection display 200 may have improved light efficiency, improved color reproduction, and/or provide a user with preferred color and intensity of light. Projecting lens module 60 projects images on light emitting module 10 to screen module 70. Each pixel 11 of light emitting module 10 may function as a pixel of an image on the screen of the projection display 200.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A light emitting module comprising:
   a substrate; and
   a plurality of LED pixels arranged in a two-dimensional array,
   wherein each of the LED pixels comprises:
   a first layer formed on the substrate by deposition technique;
   a first light-emitting active layer on the first layer, wherein a portion of a surface of the first layer is exposed by the first light-emitting active layer;
   a second layer on the first light-emitting active layer;
   an intermediate layer on the second layer, wherein a portion of a surface of the second layer is exposed by the intermediate layer;
   a third layer on the intermediate layer;
   a second light-emitting active layer on the third layer, wherein a portion of a surface of the third layer is exposed by the second light-emitting active layer;

a fourth layer on the second light-emitting active layer; and first, second, third, and fourth electrode pads respectively formed on the exposed portions of surfaces of the first layer, the second layer, and the third layer and a surface of the fourth layer, wherein the first light-emitting active layer is driven by the first and second pads to emit one color of light, and the second light-emitting active layer is driven by the third and fourth pads to emit another color of light.

2. The light emitting module in claim 1, wherein the second electrode pad on the second layer is electrically connected to the third electrode pad on the third layer, and the intermediate layer electrically connects the second layer and the third layer.

3. The light emitting module in claim 1, wherein the intermediate layer comprises an adhesive material.

4. The light emitting module in claim 1, wherein the intermediate layer comprises conductive particles.

5. The light emitting module in claim 1, wherein the pixel further comprises:
a fifth layer on the substrate; and
a third light-emitting active layer on the fifth layer;
a sixth layer on the third light-emitting active layer; and
fifth and sixth electrode pads respectively formed on the fifth layer and the sixth layer; and
wherein the third light-emitting active layer emits a color of light different from the color of light emitted from the first light-emitting active layer and the second light-emitting active layer.

6. The light emitting module in claim 1, wherein the intermediate layer is a first intermediate layer, the pixel further comprising:
a second intermediate layer formed on the fourth layer, the second intermediate layer comprising an adhesive material;
a fifth layer on the second intermediate layer;
a third light-emitting active layer on the fifth layer;
a sixth layer on the third light-emitting active layer; and
fifth and sixth electrode pads respectively formed on the fifth layer and the sixth layer,
wherein the third light-emitting active layer emits a color of light different from the color of light emitted from the first light-emitting active layer and the second light-emitting active layer.

7. The light emitting module in claim 1, wherein the substrate is a first substrate, the light emitting module further comprising a second substrate interposed between the intermediate layer and the third layer.

8. A flat panel display, comprising a light emitting module as claimed in claim 1.

9. A projection display, comprising a light emitting module as claimed in claim 1.

10. The light emitting module in claim 1, wherein at least a portion of an upper surface of the first layer is not covered by the first light-emitting active layer and the second layer.

11. The light emitting module in claim 1, wherein at least a portion of an upper surface of the second layer is not covered by the intermediate layer.

12. The light emitting module in claim 1, wherein at least a portion of an upper surface of the third layer is not covered by the second light-emitting active layer and the fourth layer.

13. The light emitting module in claim 1, wherein the substrate includes $Al_2O_3$, GaAs, GaP, SiC, or any combination thereof.

14. The light emitting module in claim 5, wherein at least a portion of an upper surface of the fifth layer is not covered by the third light-emitting active layer and the sixth layer.

15. The light emitting module in claim 5, wherein the fifth layer comprises a material the same as a material in one of the first layer, the second layer, the third layer, and the fourth layer.

16. The light emitting module in claim 5, wherein the sixth layer comprises a material the same as a material in one of the first layer, the second layer, the third layer, and the fourth layer.

17. The light emitting module in claim 6, wherein the fourth electrode pad on the fourth layer is electrically connected to the fifth electrode pad on the fifth layer, and the intermediate layer electrically connects the fourth layer and the fifth layer.

18. The light emitting module in claim 6, wherein the substrate is a first substrate, the light emitting module further comprising a second substrate interposed between the first intermediate layer and the third layer.

19. The light emitting module in claim 6, wherein at least a portion of an upper surface of the fourth layer is not covered by the second intermediate layer.

20. The light emitting module in claim 6, wherein at least a portion of an upper surface of the fifth layer is not covered by the third light-emitting active layer and the sixth layer.

21. The flat panel display in claim 8, further comprising:
a screen module; and
a light guiding module configured to transmit light from the light emitting module to the screen module.

22. The projection display in claim 9, further comprising:
a screen module; and
a projecting lens module configured to project an image on the light emitting modules to the screen module.

* * * * *